United States Patent
Wang et al.

(10) Patent No.: US 11,871,685 B2
(45) Date of Patent: Jan. 9, 2024

(54) RESISTIVE RANDOM-ACCESS MEMORY (RRAM) DEVICE AND FORMING METHOD THEREOF

(71) Applicant: UNITED MICROELECTRONICS CORP., Hsin-Chu (TW)

(72) Inventors: Wen-Jen Wang, Tainan (TW); Chun-Hung Cheng, Kaohsiung (TW); Chuan-Fu Wang, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 336 days.

(21) Appl. No.: 17/378,795

(22) Filed: Jul. 19, 2021

(65) Prior Publication Data
US 2022/0399495 A1    Dec. 15, 2022

(30) Foreign Application Priority Data
Jun. 9, 2021    (CN) .......................... 202110641056.5

(51) Int. Cl.
*H10N 70/00* (2023.01)
*H10N 70/20* (2023.01)

(52) U.S. Cl.
CPC ......... *H10N 70/841* (2023.02); *H10N 70/011* (2023.02); *H10N 70/24* (2023.02); *H10N 70/826* (2023.02); *H10N 70/8833* (2023.02)

(58) Field of Classification Search
CPC ..................................... H10N 70/00
See application file for complete search history.

(56) References Cited

U.S. PATENT DOCUMENTS

| | | | |
|---|---|---|---|
| 2013/0112936 A1* | 5/2013 | Wei .................. | H10N 70/026 257/4 |
| 2016/0087199 A1* | 3/2016 | Jang .................. | H10N 70/021 257/4 |
| 2021/0074917 A1* | 3/2021 | Su .................... | H10N 70/063 |

\* cited by examiner

*Primary Examiner* — Marvin Payen
(74) *Attorney, Agent, or Firm* — Winston Hsu

(57) ABSTRACT

A RRAM device includes a bottom electrode, a resistive material layer, a high work function layer, a top electrode, a hard mask and high work function sidewall parts. The bottom electrode, the resistive material layer, the high work function layer, the top electrode and the hard mask are sequentially stacked on a substrate. The high work function sidewall parts cover sidewalls of the top electrode and sidewalls of the hard mask, thereby constituting a RRAM cell. A method of forming said RRAM device is also provided.

20 Claims, 4 Drawing Sheets

RESISTIVE RANDOM-ACCESS MEMORY (RRAM) DEVICE AND FORMING METHOD THEREOF

BACKGROUND OF THE INVENTION

1. Field of the Invention

The present invention relates to a resistive random-access memory (RRAM) device and forming method thereof, and more particularly, to a resistive random-access memory (RRAM) device applying high work function spacer parts and forming method thereof.

2. Description of the Prior Art

In semiconductor processes, a resistive random-access memory is composed of two upper and lower metal electrodes and a transition metal oxide (TMO). The operating theory is to use the variable resistance of the transition metal oxide. The applied bias voltage changes to induce different resistance values, and the internal stored value is determined by the internal resistance.

SUMMARY OF THE INVENTION

The present invention provides a resistive random-access memory (RRAM) device and forming method thereof, which forms high work function spacer parts on sidewalls of a top electrode and on sidewalls of a hard mask, to connect above via directly and hence avoid open circuit.

The present invention provides a resistive random-access memory (RRAM) device including a bottom electrode, a resistive material layer, a high work function layer, a top electrode, a hard mask and high work function sidewall parts. The bottom electrode, the resistive material layer, the high work function layer, the top electrode and the hard mask are sequentially stacked on a substrate. The high work function sidewall parts cover sidewalls of the top electrode and sidewalls of the hard mask, thereby constituting a RRAM cell.

The present invention provides a method of forming a resistive random-access memory (RRAM) device including the following steps. A bottom electrode layer, a resistive layer, a high work function material layer, a top electrode layer and a hard mask layer are sequentially deposited on a substrate. The hard mask layer and the top electrode layer are patterned to form a top electrode and a hard mask, and thus exposing the high work function material layer. The high work function material layer is patterned to form a high work function layer and high work function sidewall parts covering sidewalls of the top electrode and sidewalls of the hard mask. The resistive layer and the bottom electrode layer are patterned to form a resistive material layer and a bottom electrode, thereby constituting a RRAM cell.

According to the above, the present invention provides a resistive random-access memory (RRAM) device and forming method thereof, which sequentially stacks a bottom electrode, a resistive material layer, a high work function layer, a top electrode and a hard mask on a substrate, and forms high work function sidewall parts covering sidewalls of the top electrode and sidewalls of the hard mask. Therefore, a via on the hard mask can physically contact the high work function sidewall parts even as the via does not contact the top electrode directly, and thus avoid open circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
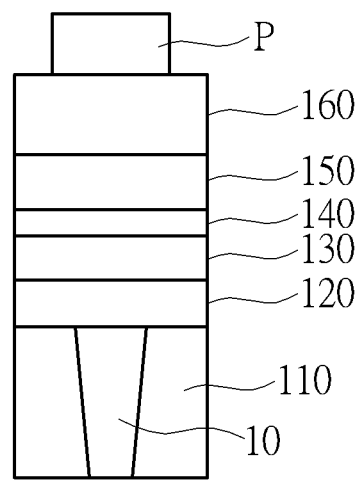
FIG. 1 schematically depicts a cross-sectional view of a method of forming a resistive random-access memory (RRAM) device according to an embodiment of the present invention.

FIGS. 1-7 schematically depict cross-sectional views of a method of forming a resistive random-access memory (RRAM) device according to an embodiment of the present invention. As shown in FIG. 1, a dielectric layer 110 is formed on a substrate (not shown). In this embodiment, the dielectric layer 110 is an oxide layer, but it is not limited thereto. The substrate may be a silicon substrate, a silicon containing substrate, a III-V group-on-silicon (such as GaN-on-silicon) substrate, a silicon carbide substrate, an aluminum oxide substrate, a graphene-on-silicon substrate or a silicon-on-insulator (SOI) substrate. In this embodiment, only a resistive random-access memory area of the substrate 110 is depicted. A conductive structure 10 is located in the dielectric layer 110, wherein the conductive structure 10 may be tungsten to electrically connect above RRAM cell.

As shown in FIG. 1, a bottom electrode layer 120, a resistive layer 130, a high work function material layer 140, a top electrode layer 150 and a hard mask layer 160 are sequentially deposited on the dielectric layer 110. A photoresist P is formed for patterning lower material layers. In this embodiment, the bottom electrode layer 120 and the top electrode layer 150 may include tantalum nitride (TaN) or titanium nitride (TiN) etc, and the resistive layer 130 may include a metal oxide layer, which preferably includes tantalum (Ta) oxide or hafnium (Hf) oxide, but it is not limited thereto. In a preferred embodiment, the high work function material layer 140 includes Iridium (Ir) for forming high work function sidewall parts by re-sputtering in later processes, but the present invention is not restricted thereto. In this case, the hard mask layer 160 includes an oxide hard mask.

Figure 2:
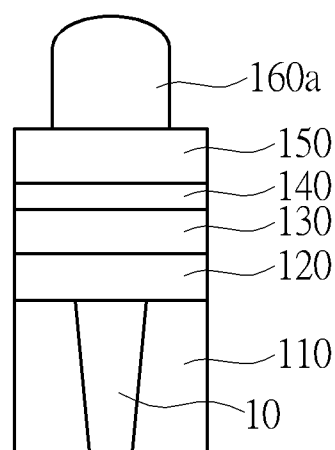
FIG. 2 schematically depicts a cross-sectional view of a method of forming a resistive random-access memory (RRAM) device according to an embodiment of the present invention.
Figure 3:
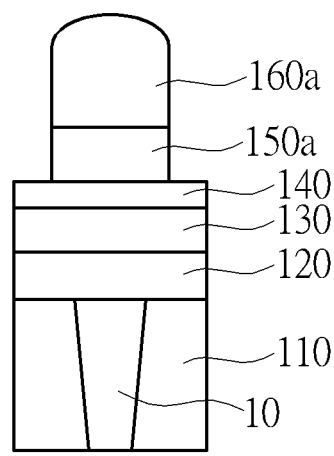
FIG. 3 schematically depicts a cross-sectional view of a method of forming a resistive random-access memory (RRAM) device according to an embodiment of the present invention.

Please refer to FIGS. 1-3, the hard mask layer 160 and the top electrode layer 150 are patterned to form a top electrode 150a and a hard mask 160a, and to expose the high work function material layer 140. As shown in FIG. 2, the hard mask layer 160 is patterned using the photoresist P to form the hard mask 160a and expose the top electrode layer 150. Then, the photoresist P is removed. As shown in FIG. 3, the top electrode layer 150 is then patterned using the hard mask 160a to form the top electrode 150a and expose the high work function material layer 140.

Figure 4:
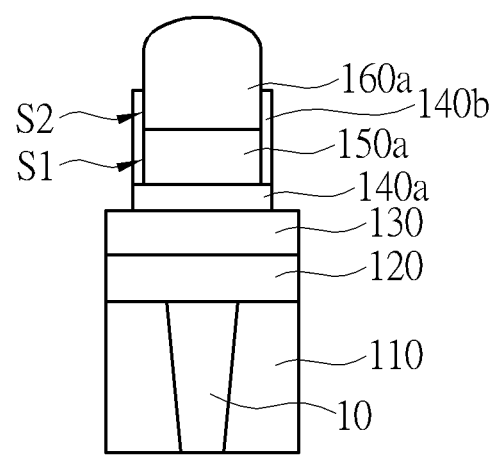
FIG. 4 schematically depicts a cross-sectional view of a method of forming a resistive random-access memory (RRAM) device according to an embodiment of the present invention.

As shown in FIG. 4, the high work function material layer 140 is patterned to form a high work function layer 140a and high work function sidewall parts 140b covering sidewalls S1 of the top electrode 150a and sidewalls S2 of the hard mask 160a. In this embodiment, the high work function sidewall parts 140b are formed by re-sputtering the high work function material layer 140 while the high work function material layer 140 is patterned. Therefore, the high work function sidewall parts 140b and the high work function layer 140a include common materials. In a preferred embodiment, the high work function sidewall parts 140b and the high work function layer 140a include Iridium (Ir) to serve as barrier layers as well as electrodes. Since the high work function sidewall parts 140b are formed by re-sputtering the high work function material layer 140 while the high work function material layer 140 is etched, the high work function sidewall parts 140b and the high work function layer 140a are one piece. Moreover, the high work function sidewall parts 140b directly stand on the high work function layer 140a due to the re-sputtering of the high work function material layer 140. The high work function sidewall parts 140b and the high work function layer 140a constitute a U-shape cross-sectional profile, but it is not limited thereto. The high work function sidewall parts 140b attach the sidewalls S1 of the top electrode 150a and the sidewalls S2 of the hard mask 160a. Thus, the cross-sectional profiles of the high work function sidewall parts 140b and the high work function layer 140a depend on the cross-sectional profiles of the top electrode 150a and the hard mask 160a.

Figure 5:
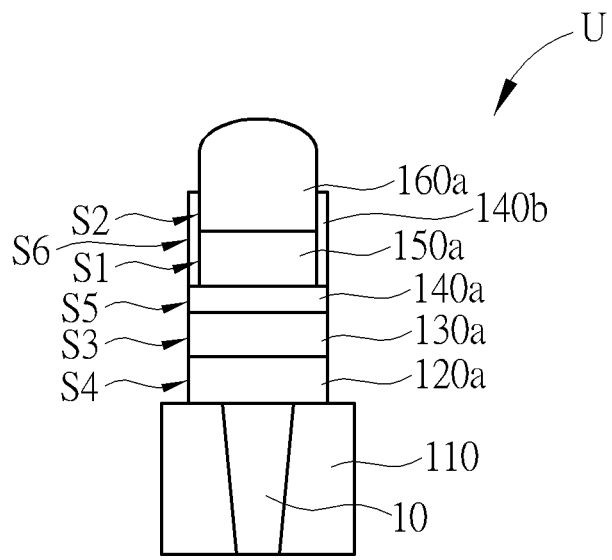
FIG. 5 schematically depicts a cross-sectional view of a method of forming a resistive random-access memory (RRAM) device according to an embodiment of the present invention.

Please refer to FIGS. 4-5, the resistive layer 130 and the bottom electrode layer 120 are patterned to form a resistive material layer 130a and a bottom electrode 120a, thereby constituting a RRAM cell U. In this embodiment, sidewalls S5 of the high work function layer 140a and sidewalls S6 of the high work function sidewall parts 140b are coplanar to sidewalls S3 of the resistive material layer 130a and sidewalls S4 of the bottom electrode 120a because of etching.

In a preferred embodiment, the steps of FIGS. 1-5 are processed in-situ. That is, the hard mask layer 160, the top electrode layer 150, the high work function material layer 140, the resistive layer 130 and the bottom electrode layer 120 are patterned in-situ to simplify processes and reduce pollution during processes. Processing parameters such as processing pressure and rotating speed in the processing chamber can be adjusted to approach requirements for each layers.

Figure 8:
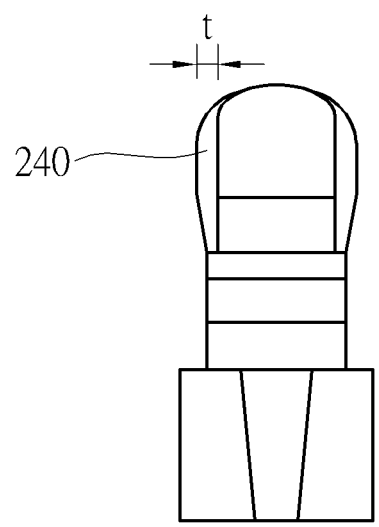
FIG. 8 schematically depicts a cross-sectional view of a resistive random-access memory (RRAM) device according to another embodiment of the present invention.

The power and the sputtering angle during re-sputtering can be adjusted to control the thickness of the formed high work function sidewall parts 140b. FIG. 8 schematically depicts a cross-sectional view of a resistive random-access memory (RRAM) device according to another embodiment of the present invention. As shown in FIG. 8, a thickness t of formed high work function sidewall parts 240 is thickened by adjusting the power and the sputtering angle during re-sputtering. Hence, the contact area of the high work function sidewall parts 240 and an above via can be increased and the contact resistance can be reduced.

Figure 6:
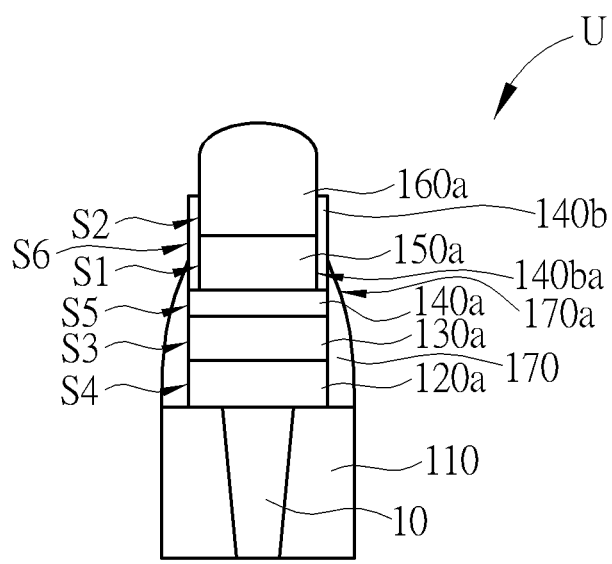
FIG. 6 schematically depicts a cross-sectional view of a method of forming a resistive random-access memory (RRAM) device according to an embodiment of the present invention.

After the step of FIG. 5, spacers 170 are formed, as shown in FIG. 6. The spacers 170 cover the sidewalls S4 of the bottom electrode 120a, the sidewalls S3 of the resistive material layer 130a, the sidewalls S5 of the high work function layer 140a and the sidewalls S6 of the high work function sidewall parts 140b. In this case, the spacers 170 includes silicon nitride spacers, but the spacers 170 may be other single layer or multilayers instead. Preferably, tops 170a of the spacers 170 overlap bottom parts 140ba of the high work function sidewall parts 140b for avoiding circuit leakage.

Figure 7:
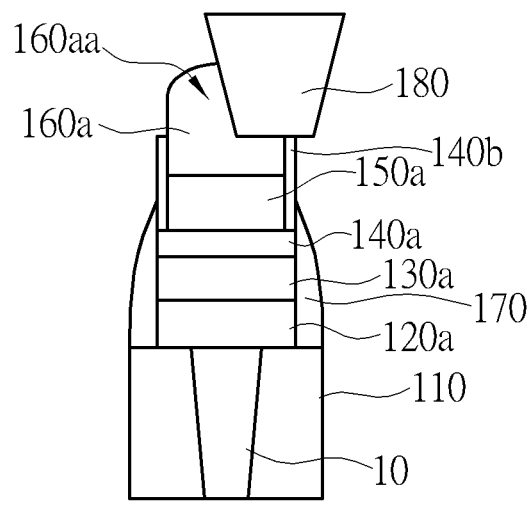
FIG. 7 schematically depicts a cross-sectional view of a method of forming a resistive random-access memory (RRAM) device according to an embodiment of the present invention.

As shown in FIG. 7, a via 180 is formed to physically contact the high work function sidewall parts 140b. The via 180 on the hard mask 160a can electrically connect the top electrode 150a by physically contacting the high work function sidewall parts 140b even as the via 180 does not penetrate through the hard mask 160a and contact the top electrode 150a directly. This avoids open circuit in the RRAM cell U. In one case, the via 180 penetrates through at least a part of a top 160aa of the hard mask 160a.

To summarize, the present invention provides a resistive random-access memory (RRAM) device and forming method thereof, which sequentially stacks a bottom electrode, a resistive material layer, a high work function layer, a top electrode and a hard mask on a substrate, and forms high work function sidewall parts covering sidewalls of the top electrode and sidewalls of the hard mask. Therefore, a via on the hard mask can physically contact the high work function sidewall parts even as the via does not contact the top electrode directly. This avoids open circuit.

Preferably, the high work function sidewall parts are formed by re-sputtering the high work function material layer while the high work function material layer is patterned. Still preferably, a hard mask layer, a top electrode layer, a high work function material layer, a resistive layer and a bottom electrode layer are patterned in-situ to form a stacked structure of the bottom electrode, the resistive material layer, the high work function layer, the top electrode and the hard mask, to simplify processes and reduce pollution during processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive random-access memory (RRAM) device, comprising:
    a bottom electrode, a resistive material layer, a high work function layer, a top electrode and a hard mask sequentially stacked on a substrate; and
    high work function sidewall parts covering sidewalls of the top electrode and sidewalls of the hard mask, thereby constituting a RRAM cell.

2. The resistive random-access memory (RRAM) device according to claim 1, wherein the bottom electrode and the top electrode comprise tantalum nitride (TaN) or titanium nitride (TiN).

3. The resistive random-access memory (RRAM) device according to claim 1, wherein the high work function sidewall parts stand on the high work function layer directly.

4. The resistive random-access memory (RRAM) device according to claim 3, wherein the high work function layer and the high work function sidewall parts comprise common materials.

5. The resistive random-access memory (RRAM) device according to claim 4, wherein the high work function sidewall parts and the high work function layer comprise Iridium (Ir).

6. The resistive random-access memory (RRAM) device according to claim 5, wherein the high work function sidewall parts and the high work function layer are one piece.

7. The resistive random-access memory (RRAM) device according to claim 6, wherein the high work function sidewall parts and the high work function layer constitute one U-shape cross-sectional profile.

8. The resistive random-access memory (RRAM) device according to claim 1, further comprising:
a via contacting the high work function sidewall parts physically, wherein the via contacts a top of the hard mask physically.

9. The resistive random-access memory (RRAM) device according to claim 8, wherein the via penetrates through at least a part of the top of the hard mask.

10. The resistive random-access memory (RRAM) device according to claim 1, further comprising:
spacers covering sidewalls of the bottom electrode, the resistive material layer and the high work function layer.

11. The resistive random-access memory (RRAM) device according to claim 10, wherein the spacers comprise silicon nitride spacers.

12. The resistive random-access memory (RRAM) device according to claim 10, wherein tops of the spacers overlap bottom parts of the high work function sidewall parts.

13. The resistive random-access memory (RRAM) device according to claim 1, wherein the resistive material layer comprises a metal oxide layer.

14. The resistive random-access memory (RRAM) device according to claim 13, wherein the metal oxide layer comprises hafnium (Hf) oxide or tantalum (Ta) oxide.

15. The resistive random-access memory (RRAM) device according to claim 1, wherein the hard mask comprises an oxide hard mask.

16. A method of forming a resistive random-access memory (RRAM) device, comprising:
sequentially depositing a bottom electrode layer, a resistive layer, a high work function material layer, a top electrode layer and a hard mask layer on a substrate;
patterning the hard mask layer and the top electrode layer to form a top electrode and a hard mask, and thus exposing the high work function material layer;
patterning the high work function material layer to form a high work function layer and forming high work function sidewall parts covering sidewalls of the top electrode and sidewalls of the hard mask; and
patterning the resistive layer and the bottom electrode layer to form a resistive material layer and a bottom electrode, thereby constituting a RRAM cell.

17. The method of forming a resistive random-access memory (RRAM) device according to claim 16, wherein the hard mask layer, the top electrode layer, the high work function material layer, the resistive layer and the bottom electrode layer are patterned in-situ.

18. The method of forming a resistive random-access memory (RRAM) device according to claim 16, wherein the high work function sidewall parts are formed by re-sputtering the high work function material layer while the high work function material layer is patterned.

19. The method of forming a resistive random-access memory (RRAM) device according to claim 16, further comprising:
forming spacers covering sidewalls of the bottom electrode, the resistive material layer and the high work function layer.

20. The method of forming a resistive random-access memory (RRAM) device according to claim 16, wherein the high work function layer and the high work function sidewall parts comprise Iridium (Ir).

* * * * *